United States Patent
Su et al.

(10) Patent No.: US 9,166,134 B2
(45) Date of Patent: Oct. 20, 2015

(54) LIGHT EMITTING ELEMENT, BACKLIGHT MODULE, LIQUID CRYSTAL DISPLAY DEVICE

(71) Applicant: BEIJING BOE OPTOELECTRONICS TECHNOLOGY CO., LTD., Beijing (CN)

(72) Inventors: Yuefeng Su, Beijing (CN); Haiwei Sun, Beijing (CN); Jingshi Li, Beijing (CN)

(73) Assignee: BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 36 days.

(21) Appl. No.: 14/093,789

(22) Filed: Dec. 2, 2013

(65) Prior Publication Data

US 2014/0197444 A1    Jul. 17, 2014

(30) Foreign Application Priority Data

Jan. 16, 2013    (CN) .......................... 2013 1 0016745

(51) Int. Cl.
*H01L 33/00*    (2010.01)
*H01L 33/64*    (2010.01)
*H01L 33/50*    (2010.01)

(52) U.S. Cl.
CPC ............ *H01L 33/648* (2013.01); *H01L 33/501* (2013.01)

(58) Field of Classification Search
CPC .................................................... H01L 33/648
USPC .......................................................... 257/99
See application file for complete search history.

(56) References Cited

U.S. PATENT DOCUMENTS

2011/0267805 A1    11/2011    Hua et al.

FOREIGN PATENT DOCUMENTS

| CN | 101082405 A | 12/2007 |
| CN | 101457918 A | 6/2009 |
| CN | 101655189 A | 2/2010 |
| CN | 101696775 A | 4/2010 |
| CN | 102671979 A | 9/2012 |

OTHER PUBLICATIONS

First Office Action issued by the Chinese Patent Office for Chinese Patent Application No. 201310016745.2 dated Jul. 17, 2014, 10pgs.
English translation of First Office Action issued by the Chinese Patent Office for Chinese Patent Application No. 201310016745.2 dated Jul. 17, 2014, 8pgs.
Second Office Action (Chinese language) issued by the State Intellectual Property Office ("SIPO") for Chinese Patent Application No. 201310016745.2 dated Mar. 9, 2015, 8 pages.
English translation of Second Office Action (listed above) issued by SIPO for Chinese Patent Application No. 2013100167452 dated Mar. 9, 2015, 8 pages.
English Abstract of CN101457918A, listed above, 1 page.

*Primary Examiner* — Theresa T Doan
(74) *Attorney, Agent, or Firm* — Ladas & Parry LLP

(57) ABSTRACT

A light emitting element comprises: a printed circuit board, a chip disposed on a first face of the printed circuit board, a first encapsulation body and a second encapsulation body. The first encapsulation body covers the chip, and the second encapsulation body covers a second face of the printed circuit board or a part of the second face of the printed circuit board. A first pipe and a second pipe are extended respectively from two positions of the first encapsulation body and are respectively connected to two positions of the second encapsulation body. Fluid is encapsulated within the first encapsulation body, the first pipe, the second encapsulation body and the second pipe.

9 Claims, 1 Drawing Sheet

US 9,166,134 B2

LIGHT EMITTING ELEMENT, BACKLIGHT MODULE, LIQUID CRYSTAL DISPLAY DEVICE

CROSS REFERENCE TO RELATED APPLICATIONS

This application claims priority from Chinese National Application No. 201310016745.2 filed on Jan. 16, 2013, the contents of which are incorporated herein by reference.

TECHNICAL FIELD

Embodiments of the present disclosure relate to a light emitting element, a backlight module, a liquid crystal display device, and an illumination apparatus.

BACKGROUND

The core component of a light emitting diode (LED) is a semiconductor chip, which comprises two parts, i.e., a P-type semiconductor and an N-type semiconductor. When the two semiconductors are joined to each other, a "PN junction" is formed therebetween. When the current acts on the chip through wires, electrons will be pushed toward the P-type semiconductor region, in which electrons from the N-type semiconductor recombine with holes in the P-type semiconductor and at last emit energy in the form of photons.

If the heat dissipation problem of an LED can not be solved, the LED will have a high junction temperature. According to the Arrhenius law, the service life of the LED may be prolonged twice for each decrease by 10° C. of the junction temperature. Therefore, it is the key for improving the service life of LED to solve the heat dissipation problem of the LED.

SUMMARY

The embodiments of the present disclosure provide a light emitting element, a backlight module, a liquid crystal display device and an illumination apparatus, and the structure of the light emitting element can effectively improve the heat dissipation effect of the light emitting element, decrease the junction temperature of the light emitting element, and prolong the service life of the light emitting element accordingly.

One aspect of the present disclosure provides a light emitting element, comprising: a printed circuit board, a chip disposed on a first face of the printed circuit board, a first encapsulation body and a second encapsulation body. The first encapsulation body covers the chip, and the second encapsulation body covers a second face of the printed circuit board or a part of the second face of the printed circuit board. A first pipe and a second pipe are extended respectively from two positions of the first encapsulation body and are respectively connected to two positions of the second encapsulation body. Fluid is encapsulated within the first encapsulation body, the first pipe, the second encapsulation body and the second pipe.

When the chip is energized to operation with heat generation, the fluid is heated to circulate within the first encapsulation body, the first pipe, the second encapsulation body and the second pipe.

For example, the fluid may contain fluorescent powders and heat conducting liquid in which the fluorescent powders are uniformly dispersed.

For example, the surfaces of the chip may be coated with a transparent protective layer.

For example, the light emitting element may further comprise one-way valves disposed in the first pipe and the second pipe.

For example, the first encapsulation body may comprise a first jacket surrounding the chip, a first piston closing the first jacket and capable of moving against the inner wall of the first jacket, and fluid encapsulated within the first jacket.

For example, the second encapsulation body may comprise a second jacket surrounding a second face of the printed circuit board or a part of the second face of the printed circuit board, a second piston closing the second jacket and capable of moving against the inner wall of the second jacket, and fluid encapsulated within the second jacket.

For example, the light emitting element may comprise a heat dissipating member disposed on the second encapsulation body.

A second aspect of the present disclosure provides a backlight module, comprising the aforementioned light emitting element.

A third aspect of the present disclosure provides a liquid crystal display device, comprising the aforementioned backlight module.

A fourth aspect of the present disclosure provides an illumination apparatus, comprising the aforementioned light emitting element.

Further scope of applicability of the present disclosure will become apparent from the detailed description given hereinafter. However, it should be understood that the detailed description and specific examples, while indicating preferred embodiments of the disclosure, are given by way of illustration only, since various changes and modifications within the spirit and scope of the disclosure will become apparent to those skilled in the art from the following detailed description.

BRIEF DESCRIPTION OF THE DRAWINGS

In order to clearly illustrate the technical solutions in the embodiments of the disclosure or in the prior arts, the drawings of the embodiments will be briefly described in the following; it is obvious that the described drawings are only related to some embodiments of the disclosure and thus are not limitative of the disclosure.

REFERENCE SIGNS

1—printed circuit board; 2—chip; 3—the first encapsulation body; 31—the first jacket; 32—the first piston; 4—the second encapsulation body; 41—the second jacket; 42—the second piston; 5—the first pipe; 6—the second pipe; 7—one-way valve.

DETAILED DESCRIPTION

The technical solutions in the embodiments of the present disclosure will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

During the research, the inventors have found that the conventional methods of heat dissipation usually adopt such substrates of good heat dissipation properties, but normally the materials for such kinds of substrates are expensive. So the problem of heat dissipation of LED has not been effectively solved.

Embodiment 1

Figure 1:
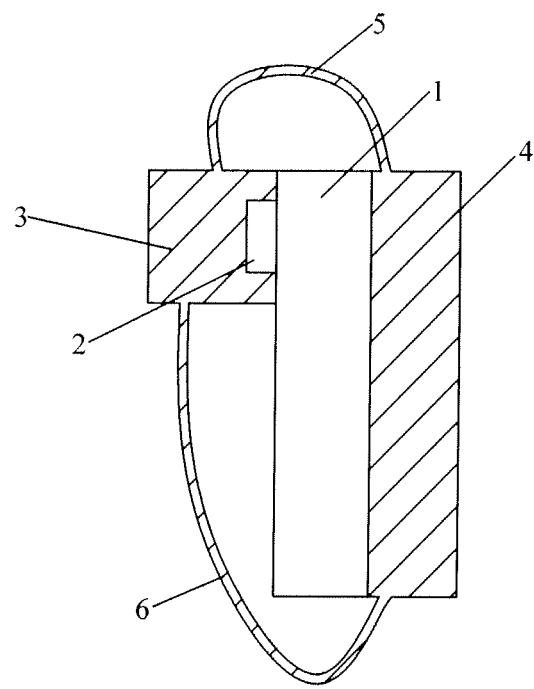
FIG. 1 is a first structural schematic view of the light emitting element according to an embodiment of the present disclosure.

The present embodiment provides a light emitting element. As illustrated in FIG. 1, the light emitting element comprises a printed circuit board 1 and a chip 2 disposed on a first face of the printed circuit board 1. The light emitting element further comprises a first encapsulation body 3 and a second encapsulation body 4. The first encapsulation body 3 covers the chip 2, and the second encapsulation body 4 covers a second face of the printed circuit board 1 or a part of the second face of the printed circuit board 1. A first pipe 5 and a second pipe 6 are extended respectively from two positions of the first encapsulation body 3 and are respectively connected to two positions of the second encapsulation body 4. The two positions of the first encapsulation body 3 may be on two opposite sides; and the two positions of the second encapsulation body 4 may be on two opposite sides. Fluid is encapsulated within the first encapsulation body 3, the first pipe 5, the second encapsulation body 4 and the second pipe 6.

The chip 2 is energized to operate and therefore generates heat so that the fluid is heated to circulate within the first encapsulation body 3, the first pipe 5, the second encapsulation body 4 and the second pipe 6.

During the operation of the light emitting element, the chip 2 generates heat and accordingly the fluid around the chip 2 is heated, whereby the pressure inside the fluid around the chip 2 becomes bigger than that in other places. Then, the fluid encapsulated within the light emitting element flows toward other places having a smaller pressure under the pressure from the inside of the fluid itself such that it circulates in the first encapsulation body 3, the first pipe 5, the second encapsulation body 4 and the second pipe 6. Because of the circulation of the fluid, the heat energy from the chip 2 is transferred to other places in the light emitting element and gradually dissipates in the process of transferring. In this case, the heat dissipation effect of the light emitting element is effectively improved, the junction temperature of the light emitting element is decreased, and the service life of the light emitting element is prolonged accordingly.

Generally, the size of the second encapsulation body 4 may be arbitrarily elected according to the practical needs, but a preferable embodiment is that the second encapsulation body 4 covers the entire second face of the printed circuit board. In this case, the surface area of the second encapsulation body 4 become greater, i.e., the area of heat dissipation become greater, so the heat dissipation effect of the light emitting element can be further improved.

It should be noted that the ports of the first pipe 5 and the second pipe 6 on the first encapsulation body 3 are in different positions spaced from each other without contacting. Similarly, the ports of the first pipe 5 and the second pipe 6 on the second encapsulation body 4 are in different positions. Based on the above, the ports of the first pipe 5 on the first encapsulation body 3 and on the second encapsulation body 4 may be arbitrarily set, and so may the ports of the second pipe 6 on the first encapsulation body 3 and on the second encapsulation body 4. FIG. 1 only shows one of the embodiments and shall not be the limitation onto the present disclosure.

In the present embodiment, the light emitting element comprises a first encapsulation body, a first pipe, a second encapsulation body and a second pipe that encapsulate the fluid within them together. During the operation of the light emitting element, the chip generates heat and accordingly the fluid is heated to circulate within the first encapsulation body, the first pipe, the second encapsulation body and the second pipe. The heat energy from the chip is transferred to other places in the light emitting element and gradually dissipates in the process of transferring. In this case, the heat dissipation effect of the light emitting element is effectively improved, the junction temperature of the light emitting element is decreased, and the service life of the light emitting element is prolonged accordingly.

Embodiment 2

On the basis of the embodiment 1, the present embodiment provides a light emitting element, in which the fluid contains fluorescent powders and heat conducting liquid in which the fluorescent powders are uniformly dispersed. It is ensured that the fluorescent powders in the fluid around the chip 2 of the light emitting element has a stable density during the circulation of the fluid, and that the light emitting element emits light of a stable color.

Furthermore, in order to prevent the chip 2 from being affected by the abrasion caused during the flow of the fluid, the surface of the chip 2 may be coated with a transparent protective layer not affecting the light exit of the chip 2.

Figure 2:
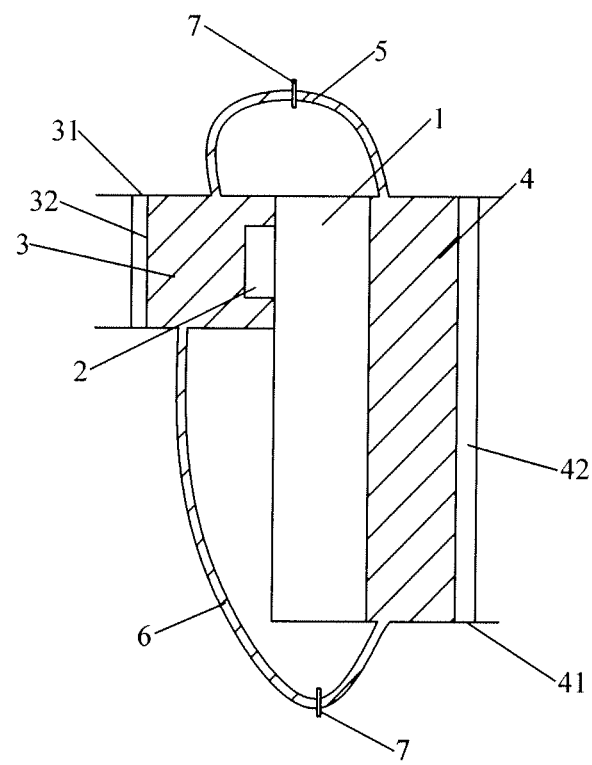
FIG. 2 is a second structural schematic view of the light emitting element according to an embodiment of the present disclosure.

As illustrated in FIG. 2, in order to allow the fluid to flow along a single direction in the light emitting element, the light emitting element usually may comprise one-way valves 7 disposed on the first pipe 5 and the second pipe 6. The existence of the one-way valves 7 allows the fluid to circulate only in the direction of the first encapsulation body 3→the first pipe 5 the second encapsulation body 4→the second pipe 6→the first encapsulation body 3.

As illustrated in FIG. 2, for example, the first encapsulation body 3 may comprise a first jacket 31 surrounding the chip, a first piston 32 closing the first jacket 31 and capable of moving against the inner wall of the first jacket 31, and fluid encapsulated within the first jacket 31.

Similarly, for example, the second encapsulation body 4 may comprise a second jacket 41 surrounding a second face of the printed circuit board 1 or a part of the second face of the printed circuit board 1, a second piston 42 closing the second jacket 41 and capable of moving against the inner wall of the second jacket 41, and fluid encapsulated within the second jacket 41.

During the operation of the light emitting element, i.e., when the fluid (the heat conducting liquid containing fluorescent powders) is circulating in the first encapsulation body 3, the first pipe 5, the second encapsulation body 4 and the second pipe 6, the second piston 42 is moved to change the volume of the second encapsulation body 4, and the first piston 32 is moved accordingly to change the volume of the first encapsulation body 3. That is, the amount of the fluorescent powders within the first encapsulation body 3 and outside the light exit surface of the chip 2 has been changed, whereby the chromaticity of the light emitted from the light emitting element can be adjusted accordingly.

For example, the second piston 42 is moved in a direction away from the printed circuit board 1, the volume of the second encapsulation body 4 is increased, and then the fluid (the heat conducting liquid containing fluorescent powders)

in the first encapsulation body 3 is reduced. Under the external atmosphere pressure, the first piston 31 of the first encapsulation body 3 is moved in the direction toward the chip 2 until it becomes unmovable. Thus, the volume of the first encapsulation body 3 is reduced, so that the amount of fluid in the first encapsulation body 3 is reduced also, which is equivalent to the situation in which the amount of fluorescent powders in the first encapsulation body 3 is reduced and the chromaticity of the light emitted from the light emitting element is changed.

When light emitting element has a bigger overall structure, it may further comprise a heat dissipating member, for example, a fan, which may be disposed on the second encapsulation body 4. The heat dissipating member disposed on the second encapsulation body can further increase the heat dissipation speed of the light emitting element and improves the heat dissipation effect of the light emitting element.

Furthermore, an embodiment of the present disclosure further provides a backlight module. For example, the backlight module comprises a light emitting element according to FIG. 1 or FIG. 2, which light emitting element may serve as a backlight source in the backlight module. Due to the good heat dissipation effect of the element, it is ensured that the backlight module may work stably with a long service life.

Accordingly, an embodiment of the present disclosure further provides a liquid crystal display device, which comprises the aforementioned backlight module. Since the backlight module has good heat dissipation effect and a long service life, the liquid crystal display device has better display effect and more stable performance.

Furthermore, an embodiment of the present disclosure further provides an illumination apparatus, which comprises a light emitting element according to FIG. 1 or FIG. 2 for example and has the effects of good heat dissipation and stable light exit.

Therefore, the protection scope of the present disclosure shall be determined by the attached claims.

What is claimed is that:

1. A light emitting element, comprising:
a printed circuit board;
a chip disposed on a first face of the printed circuit board; and
a first encapsulation body and a second encapsulation body;
wherein the first encapsulation body covers the chip, the second encapsulation body covers a second face of the printed circuit board or a part of the second face of the printed circuit board, a first pipe and a second pipe are extended respectively from two positions of the first encapsulation body and are respectively connected to two positions of the second encapsulation body, and fluid is encapsulated within the first encapsulation body, the first pipe, the second encapsulation body and the second pipe.

2. The light emitting element according to claim 1, wherein the fluid contains fluorescent powders and heat conducting liquid in which the fluorescent powders are uniformly dispersed.

3. The light emitting element according to claim 2, wherein the surfaces of the chip may be coated with a transparent protective layer.

4. The light emitting element according to claim 1, further comprising one-way valves disposed in the first pipe and the second pipe.

5. The light emitting element according to claim 1, wherein the first encapsulation body comprises a first jacket surrounding the chip, a first piston closing the first jacket and capable of moving against the inner wall of the first jacket, and fluid encapsulated within the first jacket.

6. The light emitting element according to claim 1, wherein the second encapsulation body comprises a second jacket surrounding a second face of the printed circuit board or a part of the second face of the printed circuit board, a second piston closing the second jacket and capable of moving against the inner wall of the second jacket, and fluid encapsulated within the second jacket.

7. The light emitting element according to claim 1, further comprising a heat dissipating member disposed on the second encapsulation body.

8. A backlight module, comprising a light emitting element according to claim 1.

9. A light crystal display device, comprising a backlight module according to claim 8.

* * * * *